United States Patent
Aoyagi

(10) Patent No.: US 7,141,873 B2
(45) Date of Patent: Nov. 28, 2006

(54) SEMICONDUCTOR DEVICE AND METHOD OF MANUFACTURING THE SAME, CIRCUIT BOARD, AND ELECTRONIC INSTRUMENT

(75) Inventor: Akiyoshi Aoyagi, Sagamihara (JP)

(73) Assignee: Seiko Epson Corporation, Tokyo (JP)

( * ) Notice: Subject to any disclaimer, the term of this patent is extended or adjusted under 35 U.S.C. 154(b) by 59 days.

(21) Appl. No.: 10/956,050

(22) Filed: Oct. 4, 2004

(65) Prior Publication Data

US 2005/0098885 A1 May 12, 2005

(30) Foreign Application Priority Data

Oct. 10, 2003 (JP) .............................. 2003-351934

(51) Int. Cl.
*H01L 23/02* (2006.01)

(52) U.S. Cl. .................... 257/686; 257/669; 257/693; 257/737; 257/772

(58) Field of Classification Search ................ 257/686, 257/738, 669, 693, 737, 772
See application file for complete search history.

(56) References Cited

U.S. PATENT DOCUMENTS 5,994,166 A * 11/1999 Akram et al. ............... 438/108
6,222,265 B1 * 4/2001 Akram et al. ............... 257/723
6,311,888 B1 * 11/2001 Funada et al. .............. 228/106
6,507,098 B1 * 1/2003 Lo et al. ...................... 257/686
6,734,539 B1 * 5/2004 Degani et al. .............. 257/686
6,774,466 B1 * 8/2004 Kajiwara et al. ........... 257/673
2003/0141582 A1 * 7/2003 Yang et al. .................. 257/686

FOREIGN PATENT DOCUMENTS

| JP | A 11-254185 | 9/1999 |
| JP | A 2000-299407 | 10/2000 |
| JP | A 2001-093329 | 4/2001 |

* cited by examiner

*Primary Examiner*—Andy Huynh
(74) *Attorney, Agent, or Firm*—Oliff & Berridge, PLC

(57) ABSTRACT

A semiconductor device including: a semiconductor chip; a wiring board on which the semiconductor chip is mounted; and a plurality of external terminals provided on the wiring board. The external terminals include at least one first external terminal and two or more second external terminals. The first external terminal is formed of a soldering material. Each of the second external terminals includes a soldering material and a plurality of particles formed of a resin and dispersed in the soldering material. The second external terminals are a pair of external terminals among the external terminals, and a distance between the pair of external terminals is greater than a distance between any other pair of external terminals among the external terminals.

8 Claims, 6 Drawing Sheets

SEMICONDUCTOR DEVICE AND METHOD OF MANUFACTURING THE SAME, CIRCUIT BOARD, AND ELECTRONIC INSTRUMENT Japanese Patent Application No. 2003-351934, filed on Oct. 10, 2003, is hereby incorporated by reference in its entirety.

BACKGROUND OF THE INVENTION

The present invention relates to a semiconductor device and a method of manufacturing the same, a circuit board, and an electronic instrument.

In the configuration in which a semiconductor device is mounted on a circuit board, it is important to reduce a stress (thermal stress) applied to an external terminal of the semiconductor device. The external terminal is formed by a solder ball or the like, and is provided on an electrical connection section (land) of the semiconductor device. A conventional method prevents stress concentration on the external terminal by changing the planar shape of the electrical connection section or the like. However, there is a limit to this method.

BRIEF SUMMARY OF THE INVENTION

According to a first aspect of the present invention, there is provided a semiconductor device comprising:

a semiconductor chip;

a wiring board on which the semiconductor chip is mounted; and a plurality of external terminals provided on the wiring board, wherein the external terminals include at least one first external terminal and two or more second external terminals;

wherein the first external terminal is formed of a soldering material;

wherein each of the second external terminals includes a soldering material and a plurality of particles formed of a resin and dispersed in the soldering material; and wherein a distance between a pair of the second external terminals being greater than a distance between any other pair of external terminals among the external terminals.

According to a second aspect of the present invention, there is provided a semiconductor device comprising:

a first semiconductor device including a first semiconductor chip;

a second semiconductor device including a second semiconductor chip; and a plurality of external terminals which are provided between the first and second semiconductor devices and electrically connect the first and second semiconductor devices, wherein the external terminals include at least one first external terminal and two or more second external terminals;

wherein the first external terminal is formed of a soldering material;

wherein each of the second external terminals includes a soldering material and a plurality of particles formed of a resin and dispersed in the soldering material; and wherein a distance between a pair of the second external terminals being greater than a distance between any other pair of external terminals among the external terminals.

According to a third aspect of the present invention, there is provided a semiconductor device comprising:

a plurality of first semiconductor devices each of which includes a first semiconductor chip;

a second semiconductor device which includes a second semiconductor chip, the first semiconductor devices being disposed on the second semiconductor device so as not to overlap each other; and two or more groups of external terminals which are disposed between the first semiconductor devices and the second semiconductor device and electrically connect the first semiconductor devices to the second semiconductor device, each of the groups being disposed in a region of one of the first semiconductor devices, wherein at least one of the groups of the external terminals include at least one first external terminal and two or more second external terminals;

wherein the first external terminal is formed of a soldering material;

wherein each of the second external terminals includes a soldering material and a plurality of particles formed of a resin and dispersed in the soldering material;

wherein the shape of a region in which each of the groups is disposed is a rectangle; and wherein the second external terminals are disposed in opposite corner regions of the rectangle.

According to a fourth aspect of the present invention, there is provided a semiconductor device comprising:

a plurality of first semiconductor devices each of which includes a first semiconductor chip;

a second semiconductor device which includes a second semiconductor chip, the first semiconductor devices being disposed on the second semiconductor device so as not to overlap each other; and two or more groups of external terminals which are disposed between the first semiconductor devices and the second semiconductor device and electrically connect the first semiconductor devices to the second semiconductor device, each of the groups being disposed in a region of one of the first semiconductor devices, wherein at least one of the groups of the external terminals include at least one first external terminal and two or more second external terminals;

wherein the first external terminal is formed of a soldering material;

wherein each of the second external terminals includes a soldering material and a plurality of particles formed of a resin and dispersed in the soldering material;

wherein the shape of a region in which each of the groups is disposed is a rectangle; and wherein the second external terminals are disposed in a region along short sides of the rectangle.

According to a fifth aspect of the present invention, there is provided a circuit board on which any of the above-described semiconductor devices is mounted.

According to a sixth aspect of the present invention, there is provided an electronic instrument comprising any of the above-described semiconductor devices.

According to a seventh aspect of the present invention, there is provided a method of manufacturing a semiconductor device, comprising:

providing a plurality of external terminals on a wiring board on which a semiconductor chip is mounted, the external terminals including at least one first external terminal and two or more second external terminals, wherein the first external terminal is formed of a soldering material;

wherein the second external terminals are formed by dispersing a plurality of particles formed of a resin in a soldering material; and wherein a distance between a pair of the second external terminals being greater than a distance between any other pair of external terminals among the external terminals.

DETAILED DESCRIPTION OF THE EMBODIMENTS

Figure 1:
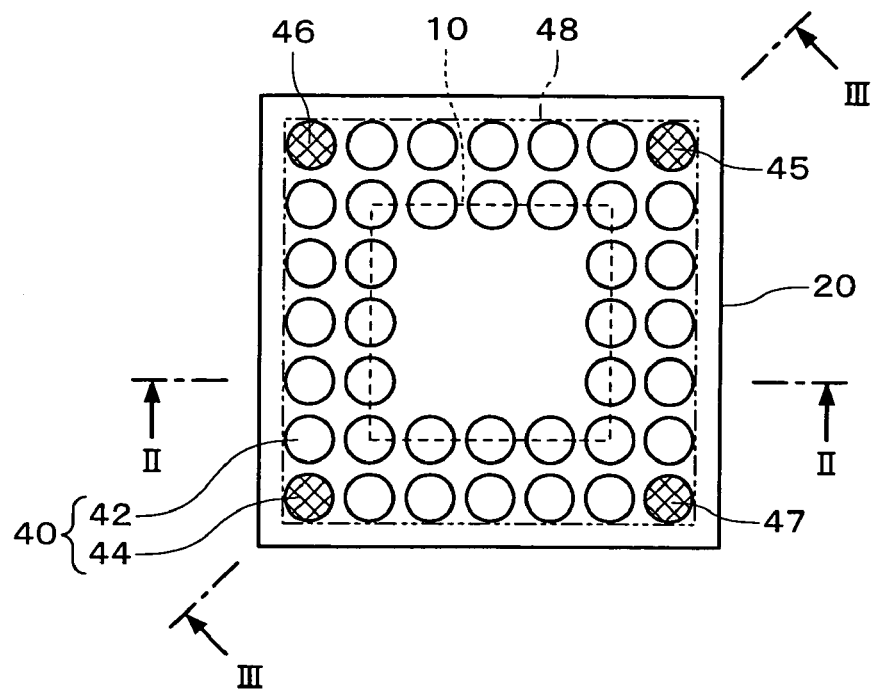
FIG. 1 is a plan view of a semiconductor device according to a first embodiment of the present invention.

An objective of the embodiments of the present invention is to reduce the stress applied to external terminals of a semiconductor device.

(1) According to one embodiment of the present invention, there is provided a semiconductor device comprising:
a semiconductor chip;
a wiring board on which the semiconductor chip is mounted; and
a plurality of external terminals provided on the wiring board,
wherein the external terminals include at least one first external terminal and two or more second external terminals;
wherein the first external terminal is formed of a soldering material;
wherein each of the second external terminals includes a soldering material and a plurality of particles formed of a resin and dispersed in the soldering material; and
wherein the second external terminals are a pair of external terminals among the external terminals, a distance between the pair of external terminals being greater than a distance between any other pair of external terminals among the external terminals.

In this semiconductor device, the second external terminals are a pair of external terminals and the distance between the second external terminals is greater than the distance between any other pair of the external terminals. Since the second external terminal includes a plurality of particles, a stress applied to the second external terminal can be reduced by the particles. The maximum stress due to expansion or shrinkage of the wiring board is applied to a pair of external terminals having a distance between them greater than a distance between any other pair of the external terminals. Therefore, the stress can be effectively reduced by disposing the second external terminals in such position.

(2) In this semiconductor device, the second external terminals may be two or more pairs of external terminals among the external terminals, a distance between each of the two or more pairs of the external terminals being greater than a distance between any other pair of external terminals among the external terminals.

(3) In this semiconductor device, the shape of a region in which the external terminals are disposed may be a quadrilateral; and the second external terminals may be disposed in corner regions of the quadrilateral. This enables the stress applied to the corner regions of the quadrilateral to be effectively reduced.

(4) According to one embodiment of the present invention, there is provided a semiconductor device comprising:
a first semiconductor device including a first semiconductor chip;
a second semiconductor device including a second semiconductor chip; and
a plurality of external terminals which are provided between the first and second semiconductor devices and electrically connect the first and second semiconductor devices,
wherein the external terminals include at least one first external terminal and two or more second external terminals;
wherein the first external terminal is formed of a soldering material;
wherein each of the second external terminals includes a soldering material and a plurality of particles formed of a resin and dispersed in the soldering material; and
wherein the second external terminals are a pair of external terminals among the external terminals, a distance between the pair of external terminals being greater than a distance between any other pair of external terminals among the external terminals.

In this semiconductor device, the second external terminals are a pair of external terminals and the distance between the second external terminals is greater than the distance between any other pair of the external terminals. Since the second external terminal includes a plurality of particles, a stress applied to the second external terminal can be reduced by the particles. The maximum stress due to expansion or shrinkage of the wiring board is applied to a pair of external terminals having a distance between them greater than a distance between any other pair of the external terminals. Therefore, the stress can be effectively reduced by disposing the second external terminals in such position.

(5) According to one embodiment of the present invention, there is provided a semiconductor device comprising:
a plurality of first semiconductor devices each of which includes a first semiconductor chip;
a second semiconductor device which includes a second semiconductor chip, the first semiconductor devices being disposed on the second semiconductor device so as not to overlap each other; and
two or more groups of external terminals which are disposed between the first semiconductor devices and the second semiconductor device and electrically connect the first semiconductor devices to the second semiconductor device, each of the groups being disposed in a region of one of the first semiconductor devices, wherein at least one of the groups of the external terminals include at least one first external terminal and two or more second external terminals;

wherein the first external terminal is formed of a soldering material;

wherein each of the second external terminals includes a soldering material and a plurality of particles formed of a resin and dispersed in the soldering material;

wherein the shape of a region in which each of the groups is disposed is a rectangle; and wherein the second external terminals are disposed in opposite corner regions of the rectangle.

In this semiconductor device, the second external terminals are a pair of external terminals among the external terminals disposed at the opposite corner regions in a rectangular terminal region. Since the second external terminal includes a plurality of particles, the stress applied to the second external terminal can be reduced by the particles. The maximum stress due to expansion or shrinkage of the wiring board is applied to the pair disposed at the opposite corner regions in a rectangular terminal region. Therefore, the stress can be effectively reduced by disposing the second external terminals in such position.

(6) According to one embodiment of the present invention, there is provided a semiconductor device comprising:

a plurality of first semiconductor devices each of which includes a first semiconductor chip;

a second semiconductor device which includes a second semiconductor chip, the first semiconductor devices being disposed on the second semiconductor device so as not to overlap each other; and two or more groups of external terminals which are disposed between the first semiconductor devices and the second semiconductor device and electrically connect the first semiconductor devices to the second semiconductor device, each of the groups being disposed in a region of one of the first semiconductor devices, wherein at least one of the groups of the external terminals include at least one first external terminal and two or more second external terminals;

wherein the first external terminal is formed of a soldering material;

wherein each of the second external terminals includes a soldering material and a plurality of particles formed of a resin and dispersed in the soldering material;

wherein the shape of a region in which each of the groups is disposed is a rectangle; and wherein the second external terminals are disposed in a region along short sides of the rectangle.

In this semiconductor device, the second external terminals are a pair of external terminals among the external terminals disposed in a region along short sides of a rectangular terminal region. Since the second external terminal includes a plurality of particles, the stress applied to the second external terminal can be reduced by the particles. A stress due to expansion or shrinkage of the wiring board tends to be applied to a pair of external terminals disposed in a region along short sides of a rectangular terminal region. Therefore, the stress can be effectively reduced by disposing the second external terminals in such position.

(7) The first semiconductor device of this semiconductor device may further include: a wiring board on which the first semiconductor chip is mounted face-up; and a resin sealing section which seals the first semiconductor chip. If the first semiconductor device includes the resin sealing section, the difference in coefficient of thermal expansion between the first and second semiconductor devices is increased, and the stress tends to be applied to the external terminals. Therefore, this is more effective in reducing the stress.

(8) In this semiconductor device, the second semiconductor device may further include a wiring board on which the second semiconductor chip is mounted face-down; and the external terminals may be arranged in a region outside the second semiconductor chip.

(9) In this semiconductor device, the external terminals may include an external terminal which are adjacent to the second external terminals and includes the same material as the second external terminals. This enables the stress to be more effectively reduced.

(10) In this semiconductor device, a surface of each of the particles may be coated by a conductive film in the second external terminals. Since the surface of the particle is coated by the conductive film, the electrical characteristics of the second external terminals can be improved. For example, if the particles are concentrated, electricity flows between the particles since the conductive films are in contact with each other. Therefore, an insulated area can be prevented from increasing.

(11) In this semiconductor device, the particles may be thermally cured. Since the particles do not melt (or rarely melt) when causing the second external terminals to melt by heating, a state in which the particles are dispersed can be maintained after the heating and melting. Therefore, the stress applied to the second external terminals can also be reduced after the heating and melting.

(12) According to one embodiment of the present invention, there is provided a circuit board on which any of the above-described semiconductor devices is mounted.

(13) According to one embodiment of the present invention, there is provided an electronic instrument comprising any of the above-described semiconductor devices.

(14) According to one embodiment of the present invention, there is provided a method of manufacturing a semiconductor device, comprising:

providing a plurality of external terminals on a wiring board on which a semiconductor chip is mounted, the external terminals including at least one first external terminal and two or more second external terminals, wherein the first external terminal is formed of a soldering material;

wherein the second external terminals are formed by dispersing a plurality of particles formed of a resin in a soldering material; and wherein the second external terminals are a pair of external terminals among the external terminals, a distance between the pair of external terminals being greater than a distance between any other pair of external terminals among the external terminals.

In this method, the external terminals are provided so that the second external terminals are a pair of external terminals and the distance between the second external terminals is greater than the distance between any other pair of the external terminals. Since the second external terminal includes a plurality of particles, a stress applied to the second external terminal can be reduced by the particles. The maximum stress due to expansion or shrinkage of the wiring board is applied to a pair of external terminals having a distance between them greater than a distance between any other pair of the external terminals. Therefore, the stress can be effectively reduced by disposing the second external terminals in such position.

The embodiments of the present invention are described below with reference to the drawings.

First Embodiment

Figure 2:
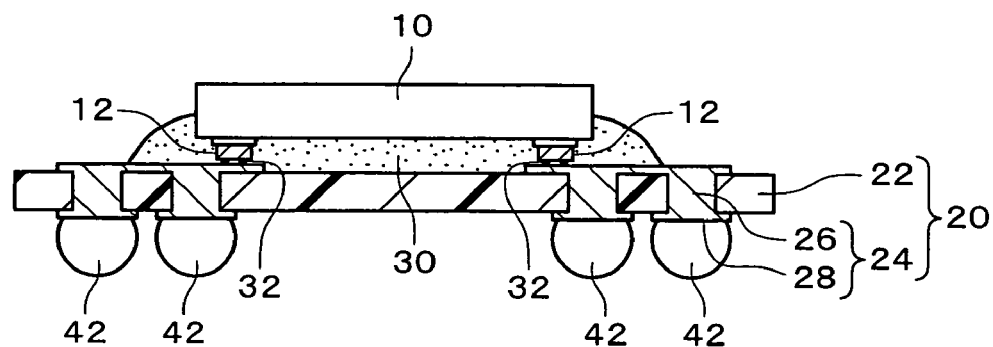
FIG. 2 is a cross-sectional view taken along the line II—II shown in FIG. 1.
Figure 3:
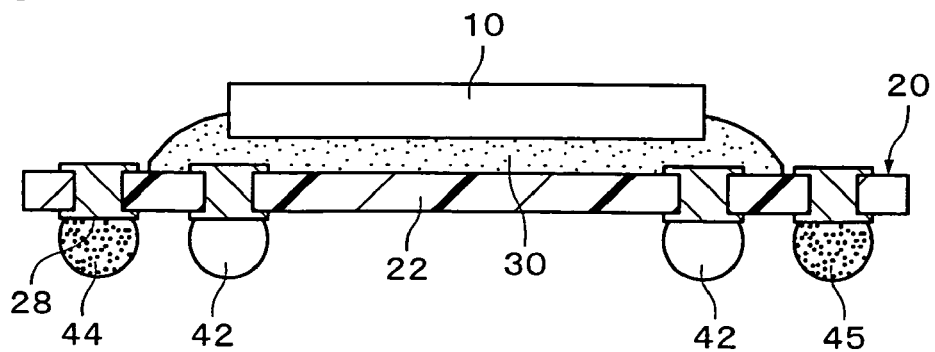
FIG. 3 is a cross-sectional view taken along the line III—III shown in FIG. 1.
Figure 4:
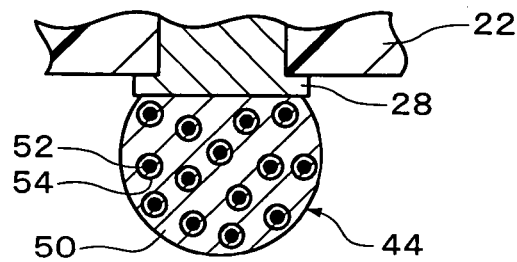
FIG. 4 is a partially enlarged view of FIG. 3.

FIG. 1 is a plan view of a semiconductor device according to a first embodiment of the present invention, FIG. 2 is a cross-sectional view taken along the line II—II shown in FIG. 1, and FIG. 3 is a cross-sectional view taken along the line III—III shown in FIG. 1. FIG. 4 is a partially enlarged view of FIG. 3. The semiconductor device according to this embodiment includes a semiconductor chip 10, a wiring board 20, and a plurality of external terminals 40.

An integrated circuit (not shown) is formed in the semiconductor chip 10, and a plurality of electrodes 12 electrically connected with the integrated circuit are formed on the semiconductor chip 10. The electrodes 12 may be formed on the semiconductor chip 10 on the side of the integrated circuit. The electrodes 12 may be formed in a region along the four sides or two sides of the surface of the semiconductor chip 10. The electrode 12 includes a pad (Al pad, for example). In the case of mounting the semiconductor chip 10 face-down on the wiring board 20, the electrode 12 may further include a bump (gold bump, for example) formed on the pad. A passivation film (not shown) is formed on the surface of the semiconductor chip 10 on which the electrode 12 is formed.

As shown in FIG. 2, the wiring board 20 includes a base substrate 22, and an interconnect pattern 24 formed on the base substrate 22. The wiring board 20 may be an interposer of the semiconductor device. The base substrate 22 is generally an organic resin substrate (epoxy substrate or polyimide substrate, for example). However, the base substrate 22 may be an inorganic substrate (glass substrate or ceramic substrate, for example), or may be an organic and inorganic composite substrate (glass epoxy substrate, for example). The interconnect pattern 24 may be formed on each side of the base substrate 22. A part of the interconnect pattern 24 may be a through-hole 26, and each side of the wiring board 20 may be electrically connected through the through-hole 26.

As shown in FIG. 2, the semiconductor chip 10 may be mounted face-down on the wiring board 20. In more detail, the surface of the semiconductor chip 10 on which the electrode 12 is formed faces the wiring board 20. The electrode 12 may be electrically connected with the interconnect pattern 24 through an anisotropic conductive material 30. The anisotropic conductive material 30 may be either an anisotropic conductive film or an anisotropic conductive paste, in which a plurality of conductive particles 32 are dispersed in a binder. The electrode 12 can be electrically connected with the interconnect pattern 24 by allowing the conductive particles 32 to be present between the electrode 12 and the interconnect pattern 24. As another electrical connection configuration, a configuration using a conductive resin paste, a metal junction (Au—Au junction, Au—Sn junction, or solder junction, for example), or shrinkage force of an insulating resin may be applied. In the case of a metal junction, a resin (underfill resin) may be provided between the semiconductor chip 10 and the wiring board 20.

As a modification, the semiconductor chip 10 may be mounted face-up on the wiring board 20. In more detail, the surface of the semiconductor chip 10 opposite to the surface on which the electrode 12 is formed may face the wiring board 20. The electrode 12 may be electrically connected with the interconnect pattern 24 using a wire. In this case, it is preferable that the semiconductor chip 10 be entirely sealed with a resin.

A plurality of electrical connection sections 28 are formed on the base substrate 22 as a part of the interconnect pattern 24. The electrical connection section 28 may be a land. In this embodiment, an external terminal 40 is provided on the electrical connection section 28. The electrical connection section 28 may be provided on the side of the base substrate 22 opposite to the side on which the semiconductor chip 10 is mounted, or may be provided on the side of the base substrate 22 on which the semiconductor chip 10 is mounted (region outside the semiconductor chip 10, for example). Specifically, the external terminal 40 may be provided on the side opposite to the surface on which the semiconductor chip 10 is mounted, or may be provided on the side on which the semiconductor chip 10 is mounted (region outside the semiconductor chip 10, for example).

The external terminal 40 has conductivity. The external terminal 40 may be in the shape of a ball. The ball shape is not necessarily a complete sphere. The ball shape may be a part of a sphere, or may be in the shape of a block. The external terminals 40 are electrically connected with the semiconductor chip 10, and may be arranged in a plurality of rows and columns. The external shape of a terminal region 48 in which the external terminals 40 are disposed may be quadrilateral (square or rectangular, for example). At least three (n×n in many cases, and n is a natural number) external terminals 40 are formed on the wiring board 20.

As shown in FIG. 1, the external terminals 40 include at least one first external terminal 42, and two or more (four in FIG. 1) second external terminals 44, 45, 46, and 47. The first external terminal 42 includes a soldering material as a major component. The soldering material may be soft solder or hard solder. The first external terminal 42 may be a conventional solder ball, and may contain flux or the like. In this embodiment, the first external terminal 42 does not contain particles formed of a resin as described later.

As shown in FIG. 4, the second external terminal 44 includes a soldering material 50 as a major component, and a plurality of particles 52 dispersed in the soldering material 50 and formed of a resin. The soldering material 50 is the same as described above and its composition is not limited. For example, the soldering material 50 may include tin (Sn) and a metallic compound (silver (Ag) and copper (Cu), for example). Flux may be further mixed in the soldering material 50. The second external terminal 44 may be a resin dispersion solder ball. This enables the stress applied to the second external terminal 44 to be reduced by the particles 52. In more detail, since the resin is softer than the soldering material 50, the stress can be absorbed or dispersed by the particles 52. Moreover, non-wetting with the soldering material 50 rarely occurs since the particles 52 are dispersed.

The component of the resin which makes up the particles 52 is not limited. For example, polystyrene, divinylbenzene, or the like may be used. The particle 52 may be formed of a thermosetting resin. In this case, the particles 52 may be thermally cured particles (completely thermally cured or thermally semi-cured particles, for example). According to this feature, since the particles 52 do not melt (or rarely melt) when causing the second external terminal 44 to melt by heating (reflowing, for example), a state in which the particles 52 are dispersed can be maintained after the heating and melting. Therefore, the stress applied to the second external terminal 44 can be reduced even after the heating and melting.

In the example shown in FIG. 4, the second external terminal 44 further includes a conductive film 54 which covers the surface of each of the particles 52. The conductive film 54 may be a metal film (copper (Cu), for example), and may be formed by plating (electroplating or electroless plating), for example. According to this feature, since the surface of the particle 52 is coated with the conductive film 54, the electrical characteristics of the second external terminal 44 can be improved. For example, if the particles 52 are concentrated, electricity flows between the particles 52 since the conductive films 54 are in contact with each other. Therefore, an insulated area can be prevented from increasing.

The arrangement of the external terminals 40 is described below. As shown in FIG. 1, the second external terminals 44 and 45 are a pair of external terminals among the external terminals 40, a distance between the pair of external terminals is greater than the distance between any other pair of the external terminals. Specifically, the second external terminal 44 is disposed on one end of the terminal region 48 (a region enclosed by the dash-dot-dot line) including the external terminals 40, and the second external terminal 45 is disposed on the opposite end. The distance between the second external terminals 44 and 45 is greater than the distance between any other pair of the external terminals. If the external shape of the terminal region 48 is quadrilateral, the second external terminals 44 and 45 are disposed at the opposite corner regions of the quadrilateral. In other words, the second external terminals 44 and 45 are disposed on each end of the diagonal line of the quadrilateral, as shown in FIG. 3. All the external terminals other than the pair of second external terminals 44 and 45 may be the first external terminals 42.

In the example shown in FIG. 1, the second external terminals 44, 45, 46, and 47 form a plurality of pairs of external terminals among the external terminals 40, and the distance between them is greater than the distance between any other pair of the external terminals. In more detail, the second external terminals 44 and 45 make a pair, and the second external terminals 46 and 47 make a pair. The distance between the second external terminals 46 and 47 is greater than the distance between any other pair of the external terminals, and is the same as the distance between the second external terminals 44 and 45. If the external shape of the terminal region 48 is quadrilateral, the second external terminals 44, 45, 46, and 47 are disposed at the four corner regions of the quadrilateral. In other words, the second external terminals 44 and 45 are disposed on each end of one diagonal line of the quadrilateral, and the second external terminals 46 and 47 are disposed on each end of the other diagonal line of the quadrilateral, as shown in FIG. 3. As shown in FIG. 1, all the external terminals other than the pairs of second external terminals 44, 45, 46, and 47 may be the first external terminals 42.

The method for disposing the external terminals 40 on the electrical connection sections 28 is not limited. In the case where the through-hole 26 includes a through-hole differing from the example shown in the drawings, the ball-shaped external terminal 40 may be caused to adhere by absorbing the external terminal 40 through the through-hole. The second external terminals 44, 45, 46, and 47 may be caused to adhere after causing the first external terminals 42 to adhere. The order may be the reverse.

According to this embodiment, the second external terminals 44 and 45 are a pair of external terminals among the external terminals 40, and a distance between the pair of external terminals is greater than the distance between any other pair of external terminals among the external terminals (disposed at the corner regions of the quadrilateral terminal region, for example). A considerable stress due to expansion or shrinkage of the wiring board 20 is applied to such areas. Therefore, the stress can be effectively reduced by disposing the second external terminals 44 and 45 in such position.

Figure 5:
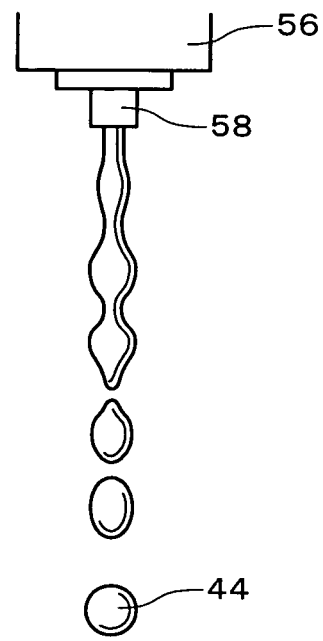
FIG. 5 is a view for illustrating a method of forming an external terminal of the semiconductor device according to the first embodiment of the present invention.

FIG. 5 is a view for illustrating a method of forming the second external terminal according to this embodiment. The particles 52 formed of a resin are mixed into a molten soldering material 50 in a crucible 56. The particles 52 may be thermally cured in advance before mixing. The surface of the particle 52 may be coated with the conductive film 54 before mixing. As the coating method, the above-mentioned plating may be applied. The soldering material 50 in the form of liquid which is molten by heating is discharged dropwise from a nozzle 58 and is cooled. In this case, a vibration is applied to the liquid soldering material 50 discharged dropwise in a predetermined direction at a predetermined frequency and amplitude. This causes the flow of liquid to be narrowed and become solid due to cooling, whereby the second external terminal 44 can be formed in the shape of a ball.

Figure 6:
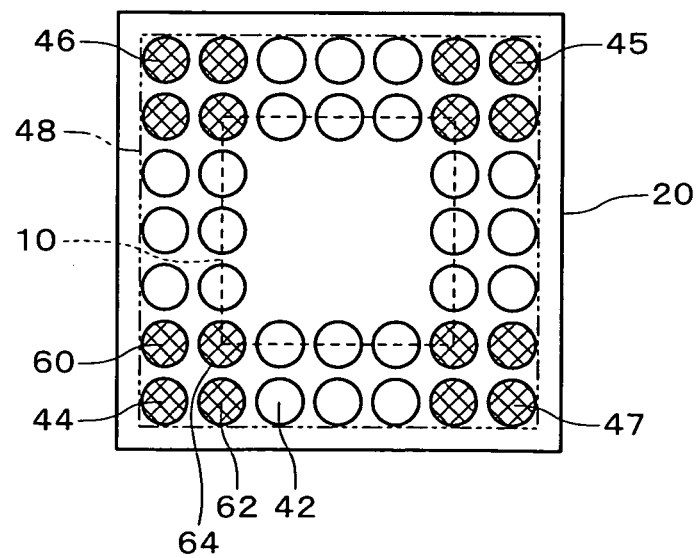
FIG. 6 is a plan view of a semiconductor device according to a modification of the first embodiment of the present invention.

FIG. 6 is a view showing a semiconductor device according to a modification of this embodiment. In this modification, the external terminal adjacent to the second external terminal 44 includes the same material as the second external terminal 44. Specifically, the external terminal adjacent to the second external terminal 44 includes at least a soldering material as a major component, and a plurality of particles dispersed in the soldering material and formed of a resin. The particle may be coated with a conductive film. In the case where a plurality of external terminals are adjacent to the second external terminal 44, one of the external terminals adjacent to the second external terminal 44 may include the same material as the second external terminal 44. In the example shown in FIG. 6, each of an external terminal 60 disposed in the adjacent line of the second external terminal 44, an external terminal 62 disposed in the adjacent column of the second external terminal 44, and an external terminal 64 diagonally adjacent to (disposed in the adjacent line and the adjacent column of) the second external terminal 44 includes the same material as the second external terminal 44. Alternatively, only one of the external terminals 60, 62, and 64 may include the same material as the second external terminal 44. As shown in FIG. 6, the same description may be applied to the external terminal adjacent to the second external terminal 45 which makes a pair with the second external terminal 44, and may be applied to the external terminal adjacent to each of the second external terminals 46 and 47. In the example shown in FIG. 6, four external terminals containing particles formed of resin (the second external terminals and external terminals including the same material as the second external terminals) are disposed at corner regions of the terminal region 48.

A method of manufacturing a semiconductor device according to this embodiment includes forming the external terminals 40 on the wiring board 20 on which the semiconductor chip 10 is mounted. The external terminals 40 include the first external terminal 42 and the second external terminals 44, 45, 46, and 47. The above description may be applied to the arrangement of the external terminals 40, and its effect is the same as described above.

Second Embodiment

Figure 7:
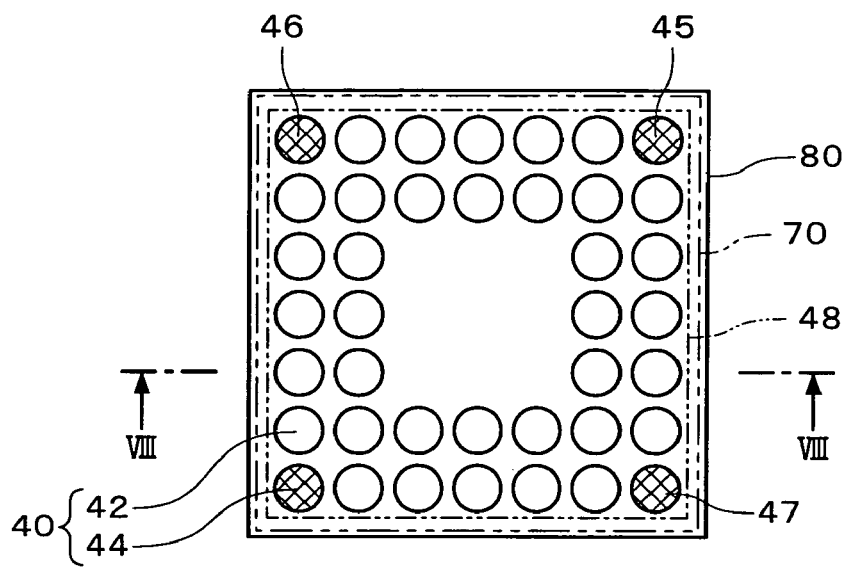
FIG. 7 is a plan view of a semiconductor device according to a second embodiment of the present invention.
Figure 8:
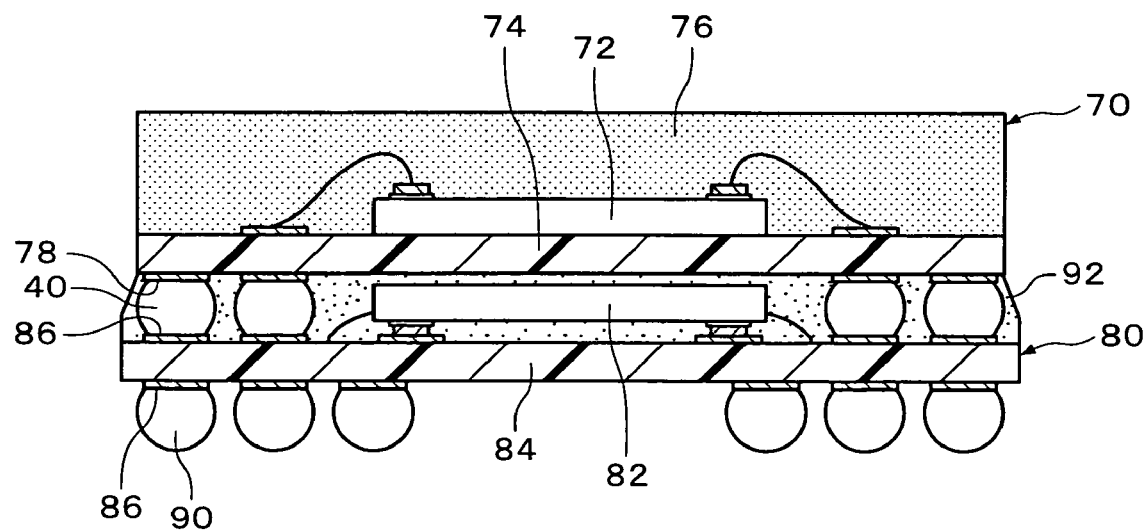
FIG. 8 is a cross-sectional view taken along the line VIII—VIII shown in FIG. 7.

FIG. 7 is a plan view of a semiconductor device according to a second embodiment of the present invention, and FIG. 8 is a cross-sectional view taken along the line VIII—VIII shown in FIG. 7. The description of the first embodiment (including the modification) can be applied to this embodiment as much as possible.

As shown in FIG. 8, the semiconductor device (stacked semiconductor device) includes first and second semiconductor devices 70 and 80, and the above-described external terminals 40 are provided between the first and second semiconductor devices 70 and 80 so as to electrically connect the upper and lower semiconductor devices. In more detail, the first semiconductor device 70 includes a semiconductor chip 72 and a wiring board 74 on which the semiconductor chip 72 is mounted, in which an electrical connection section 78 (land, for example) is formed on the wiring board 74 as a part of the interconnect pattern. The semiconductor chip 72 may be mounted face-up on the wiring board 74. The semiconductor chip 72 may be wire-bonded, and entirely sealed with a resin sealing section 76. The second semiconductor device 80 includes a semiconductor chip 82 and a wiring board 84 on which the semiconductor chip 82 is mounted, in which an electrical connection section 86 (land, for example) is formed on the wiring board 84 as a part of the interconnect pattern. The semiconductor chip 82 may be mounted face-down on the wiring board 84. The electrical connection section 86 may be formed on each side of the wiring board 84. The external terminal 40 is provided between the electrical connection section 78 of the first semiconductor device 70 and the electrical connection section 86 of the second semiconductor device 80. The external terminals 40 may be disposed in the terminal region 48, and may be arranged in the region outside the semiconductor chip 82. The external terminals 40 include at least one first external terminal 42, and two or more (four in FIG. 7) second external terminals 44, 45, 46, and 47. The description of the first embodiment may be applied to the arrangement form of the first and second external terminals. In this embodiment, the stress applied to the external terminals provided between the stacked semiconductor devices can be reduced. In particular, in the case where the first semiconductor device 70 includes the resin sealing section 76, since the difference in coefficient of thermal expansion between the first semiconductor device 70 and the second semiconductor device 80 is increased, the stress is easily applied to the external terminal 40. Therefore, it is effective to apply this embodiment.

In the example shown in FIG. 8, the external terminal 40 is formed on the electrical connection section 86 of the second semiconductor device 80 in the lowermost layer on the side opposite to the first semiconductor device 70. This enables the stacked semiconductor devices to be mounted on a circuit board. The effect is the same as described above. The space between the first and second semiconductor devices 70 and 80, specifically, the circumference of the external terminals 40 may be resin-sealed with an underfill material 92.

Third Embodiment

Figure 9:
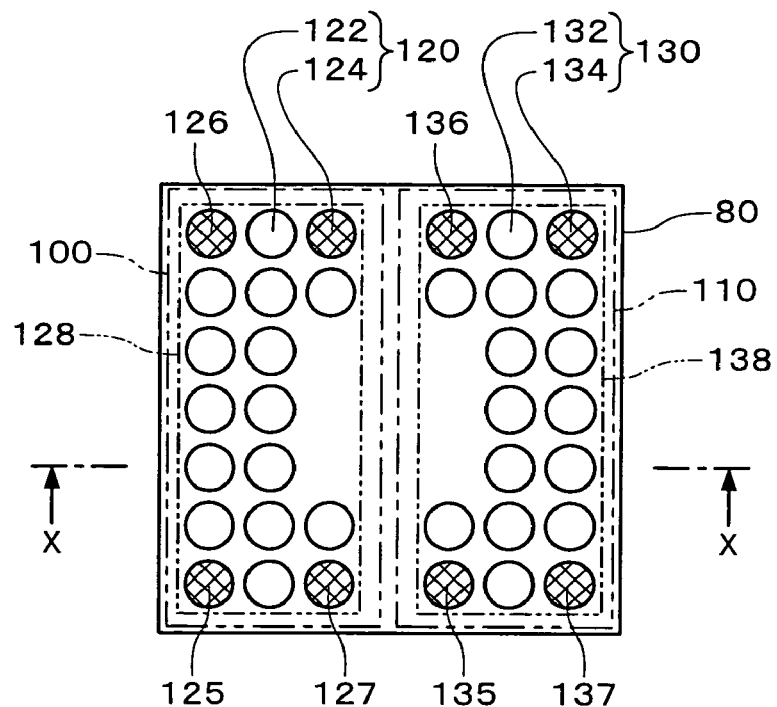
FIG. 9 is a plan view of a semiconductor device according to a third embodiment of the present invention.
Figure 10:
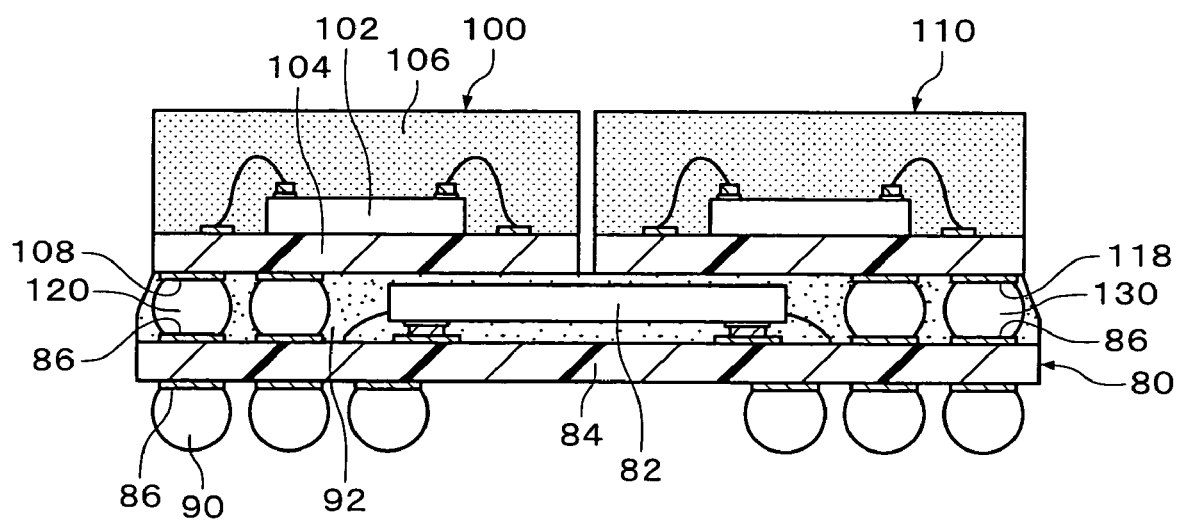
FIG. 10 is a cross-sectional view taken along the line X—X shown in FIG. 9.

FIG. 9 is a plan view of a semiconductor device according to a third embodiment of the present invention, and FIG. 10 is a cross-sectional view taken along the line X—X shown in FIG. 9. The description of the first and second embodiments (including the modification) can be applied to this embodiment as much as possible.

The semiconductor device (stacked semiconductor device) includes first semiconductor devices 100 and 110, and the second semiconductor device 80 on which the first semiconductor devices 100 and 110 are mounted so as not to overlap each other. The first semiconductor devices 100 and 110 are provided at different positions in a plane. The first semiconductor device 100 includes a first semiconductor chip 112, and a wiring board 114 on which the first semiconductor chip 112 is mounted. The first semiconductor chip 112 may be resin-sealed with a resin sealing section 116. The first semiconductor device 110 may have the same structure as the first semiconductor device 100.

A plurality of external terminals 120 (or a plurality of external terminals 130) are provided between the first semiconductor device 100 (or the first semiconductor device 110) and the second semiconductor device 80 to electrically connect the first semiconductor device 100 (or the first semiconductor device 110) with the second semiconductor device 80. The external terminals 120 and 130 are divided into a plurality of groups (two groups in FIG. 9) and respectively disposed in the regions of the first semiconductor devices 100 and 110. The external terminals 120 are provided between electrical connection sections 108 of the first semiconductor device 100 and the electrical connection sections 86 of the second semiconductor device 80, and the external terminals 130 are provided between electrical connection sections 118 of the first semiconductor device 110 and the electrical connection sections 86 of the second semiconductor device 80. Each of the external terminals 120 and 130 includes at least one first external terminal 122 or 132 and two or more second external terminals 124 to 127 or 134 to 137. As shown in FIG. 9, the first and second external terminals may be respectively disposed in the terminal regions 128 and 138 of each group. The description in the first embodiment may be applied to the arrangement form of the first and second external terminals.

In the example shown in FIG. 9, each of the terminal regions 128 and 138 is rectangular. Pairs of external terminals of at least one group (all groups in FIG. 9) disposed at the opposite corner regions of the rectangle make up the second external terminal 124 to 127 and 134 to 137. The above description may be applied to other details.

Fourth Embodiment

Figure 11:
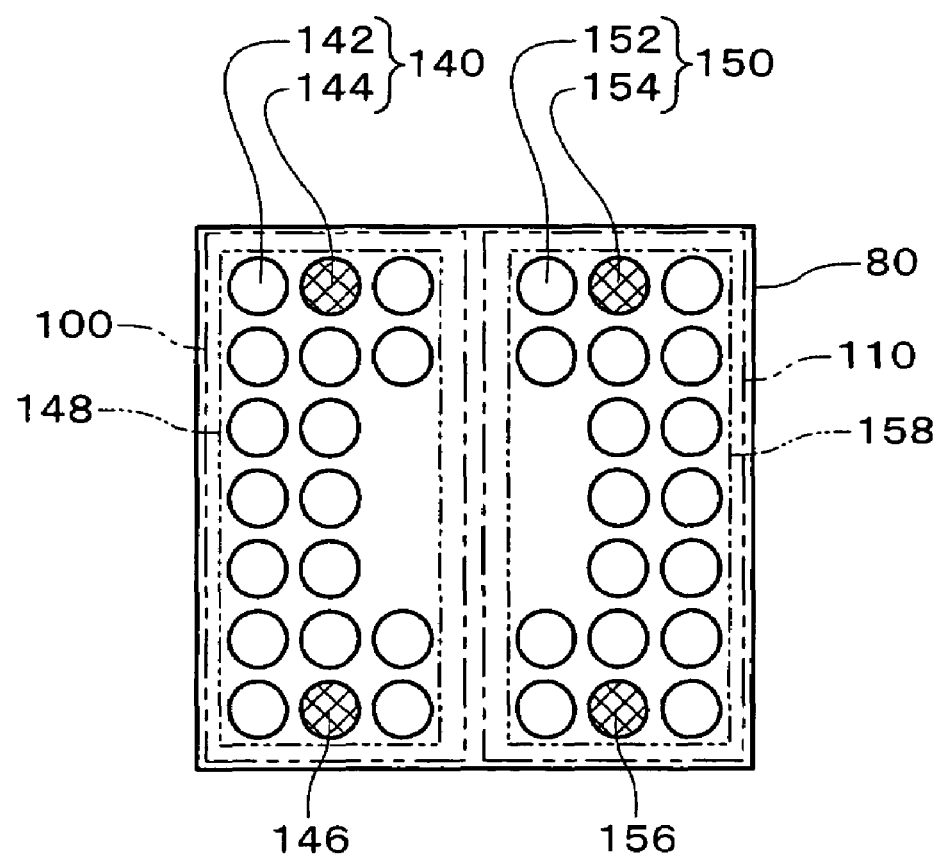
FIG. 11 is a plan view of a semiconductor device according to a fourth embodiment of the present invention.

FIG. 11 is a plan view showing a semiconductor device according to a fourth embodiment of the present invention. The description of the first to third embodiments (including the modification) can be applied to this embodiment as much as possible.

The semiconductor device (stacked semiconductor device) includes the first semiconductor devices 100 and 110, and the second semiconductor device 80 on which the first semiconductor devices 100 and 110 are mounted so as not to overlap each other. In this embodiment, the semiconductor device includes a plurality of external terminals 140 and 150 divided into a plurality of groups and respectively disposed in the regions of the first semiconductor devices 100 and 110. The external terminals 140 and 150 include first external terminals 142 and 152. This embodiment differs from the third embodiment as to the arrangement form of the first and second, external terminals.

In the example shown in FIG. 11, terminal regions 148 and 158 of each group are rectangular, and pairs of external terminals of at least one group (all groups in FIG. 11) disposed on the short sides of the rectangles are second external terminal 144, 146, 154, and 156. The second external terminals 144 and 146 (or the second external terminals 154 and 156) are disposed in the end portion (or outermost region) of the terminal region 148 (or the terminal region 158). In the case where a plurality of external terminals are disposed in the region along the short side of the rectangle, one or more (all, for example) of the external terminals may be the second external terminals. A pair of the second external terminals 144 and 146 may be arranged in the same column (line in the vertical direction in FIG. 11), or may be arranged in different columns.

Figure 12:
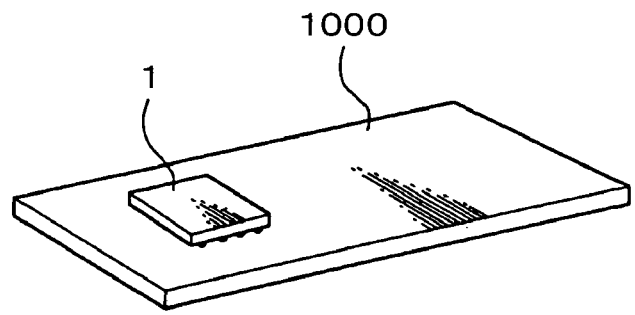
FIG. 12 is a view showing a circuit board on which is mounted the semiconductor device according to one embodiment of the present invention.
Figure 13:
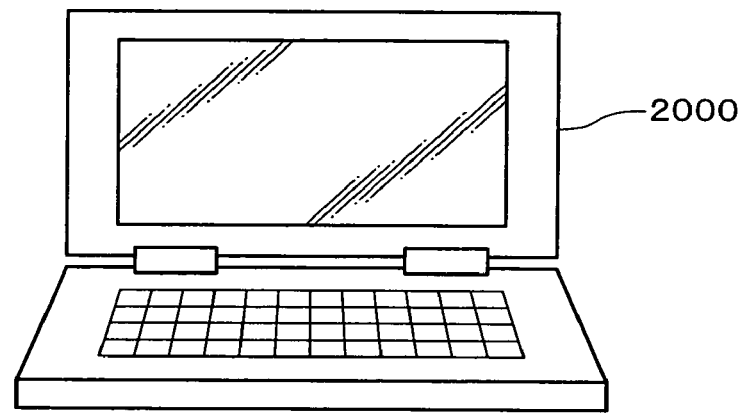
FIG. 13 is a view showing an electronic instrument having the semiconductor device according to one embodiment of the present invention.
Figure 14:
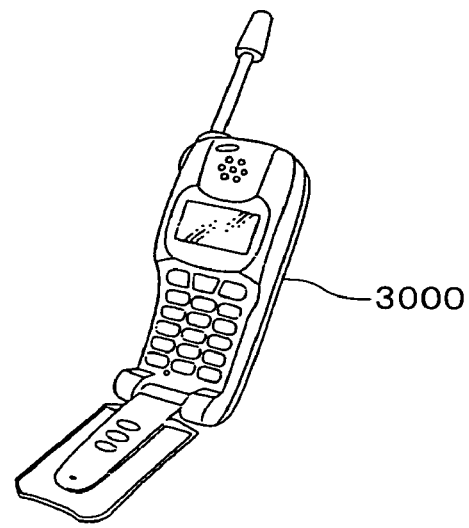
FIG. 14 is a view showing an electronic instrument having the semiconductor device according to one embodiment of the present invention.

FIG. 12 shows a circuit board 1000 on which a semiconductor device according to any of the above-described embodiments is mounted. As the mounting method, the semiconductor device and the circuit board are electrically connected by melting the external terminals of the semiconductor device by heating (reflowing). This reduces the stress applied to the external terminals of the semiconductor device during mounting and the subsequent application of thermal stress. FIGS. 13 and 14 respectively show a notebook-type personal computer 2000 and a portable telephone 3000 as electronic instruments according to an embodiment of the present invention.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A semiconductor device comprising:
   a plurality of first semiconductor devices each of which includes a first semiconductor chip;
   a second semiconductor device which includes a second semiconductor chip, the first semiconductor devices being disposed on the second semiconductor device so as not to overlap each other; and
   two or more groups of external terminals which are disposed between the first semiconductor devices and the second semiconductor device and electrically connect the first semiconductor devices to the second semiconductor device, each of the groups being disposed in a region of one of the first semiconductor devices,
   wherein at least one of the groups of the external terminals include at least one first external terminal and two or more second external terminals;
   wherein the first external terminal is formed of a soldering material;
   wherein each of the second external terminals includes a soldering material and a plurality of particles formed of a resin and dispersed in the soldering material;
   wherein the shape of a region in which each of the groups is disposed is a rectangle; and
   wherein the second external terminals are disposed in a region along short sides of the rectangle.

2. The semiconductor device as defined in claim 1,
   wherein the first semiconductor device further includes:
   a wiring board on which the first semiconductor chip is mounted face-up; and
   a resin sealing section which seals the first semiconductor chip.

3. The semiconductor device as defined in claim 1,
   wherein the second semiconductor device further includes a wiring board on which the second semiconductor chip is mounted face-down; and
   wherein the external terminals are arranged in a region outside the second semiconductor chip.

4. The semiconductor device as defined in claim 1,
   wherein the external terminals includes an external terminal which are adjacent to the second external terminals and includes the same material as the second external terminals.

5. The semiconductor device as defined in claim 1,
   wherein a surface of each of the particles is coated by a conductive film in the second external terminals.

6. The semiconductor device as defined in claim 1, wherein the particles are thermally cured.

7. A circuit board on which the semiconductor device as defined in claim 1 is mounted.

8. An electronic instrument comprising the semiconductor device as defined in claim 1.

* * * * *